US012432957B2

(12) United States Patent
Jacquet et al.

(10) Patent No.: US 12,432,957 B2
(45) Date of Patent: Sep. 30, 2025

(54) HEMT TRANSISTOR WITH GATE EXTENSION (71) Applicant: THALES, Courbevoie (FR)

(72) Inventors: Jean-Claude Jacquet, Palaiseau (FR); Philippe Altuntas, Palaiseau (FR); Sylvain Delage, Palaiseau (FR); Stéphane Piotrowicz, Palaiseau (FR)

(73) Assignee: THALES, Courbevoie (FR)

( * ) Notice: Subject to any disclaimer, the term of this patent is extended or adjusted under 35 U.S.C. 154(b) by 483 days.

(21) Appl. No.: 17/787,566

(22) PCT Filed: Dec. 18, 2020

(86) PCT No.: PCT/EP2020/087322
§ 371 (c)(1),
(2) Date: Jun. 20, 2022

(87) PCT Pub. No.: WO2021/123382
PCT Pub. Date: Jun. 24, 2021

(65) Prior Publication Data
US 2022/0406925 A1 Dec. 22, 2022

(30) Foreign Application Priority Data
Dec. 20, 2019 (FR) ........................................ 1915026

(51) Int. Cl.
*H10D 30/47* (2025.01)
*H10D 62/85* (2025.01)

(52) U.S. Cl.
CPC ....... *H10D 30/475* (2025.01); *H10D 62/8503* (2025.01)

(58) Field of Classification Search
CPC ............ H01L 29/7786; H01L 29/2003; H10D 30/475; H10D 62/8503
(Continued)

(56) References Cited

U.S. PATENT DOCUMENTS

| 2007/0194354 A1* | 8/2007 | Wu | ........................ H01L 29/402 257/E29.093 |
| 2008/0073670 A1* | 3/2008 | Yang | ...................... H01L 29/404 257/E29.253 |

(Continued)

FOREIGN PATENT DOCUMENTS

| EP | 2 763 179 A2 | 8/2014 |
| JP | 2011-210752 A | 10/2011 |

OTHER PUBLICATIONS

Park, et al., "Correlation between Physical Defects and Performance in AlGaN/GaN High Electron Mobility Transistor Devices", Transactions on Electrical and Electronic Materials, vol. 11, Issue 2, pp. 49-53, 2010.

*Primary Examiner* — Eric W Jones
(74) *Attorney, Agent, or Firm* — BakerHostetler (57) ABSTRACT

A high-mobility field-effect transistor, includes a stack along a Z axis, deposited on a substrate and comprising a buffer layer, a barrier layer, a heterojunction between the buffer layer and the barrier layer, and a two-dimensional electron gas localized in an XY plane perpendicular to the axis Z and in the vicinity of the heterojunction, a source, a drain, and a gate deposited on an upper face of the barrier layer, between the source and the drain, a first dielectric layer having a relative permittivity $\varepsilon_r$ and a thickness e which are such that: 0.5 nm ≤ $e/\varepsilon_r$ ≤ 2 nm, a metal pad arranged between the gate and the drain and deposited on the first dielectric layer, the metal pad being electrically connected to the gate.

9 Claims, 8 Drawing Sheets (58) Field of Classification Search
USPC .......................................................... 257/183
See application file for complete search history.

(56) References Cited

U.S. PATENT DOCUMENTS

| | | | |
|---|---|---|---|
| 2009/0146186 A1* | 6/2009 | Kub | .................. H01L 29/42316 |
| | | | 257/E29.315 |
| 2012/0241751 A1* | 9/2012 | Yoshioka | ............ H01L 29/0661 |
| | | | 257/E29.089 |
| 2013/0214283 A1* | 8/2013 | Briere | ................. H01L 29/2003 |
| | | | 438/285 |
| 2020/0365718 A1* | 11/2020 | Lee | ........................ H01L 29/205 |
| 2020/0373420 A1* | 11/2020 | Chou | .................. H01L 29/7786 |

* cited by examiner

HEMT TRANSISTOR WITH GATE EXTENSION

CROSS-REFERENCE TO RELATED APPLICATIONS

This application is a National Stage of International patent application PCT/EP2020/087322, filed on Dec. 18, 2020, which claims priority to foreign French patent application No. FR 1915026, filed on Dec. 20, 2019, the disclosures of which are incorporated by reference in their entirety.

FIELD OF THE INVENTION

The invention concerns the field of field-effect transistors with high electron mobility, referred to as HEMT transistors (standing for "High Electron Mobility Transistor") in GaN technology for microwave applications, typically at frequencies ranging up to 40 GHz, and 80 GHz in the near future.

More particularly, the invention relates to improvement of the reliability and gain of HEMT transistors. The invention applies to power RF HEMT transistors and to transistors for switching.

BACKGROUND

Figure 1:
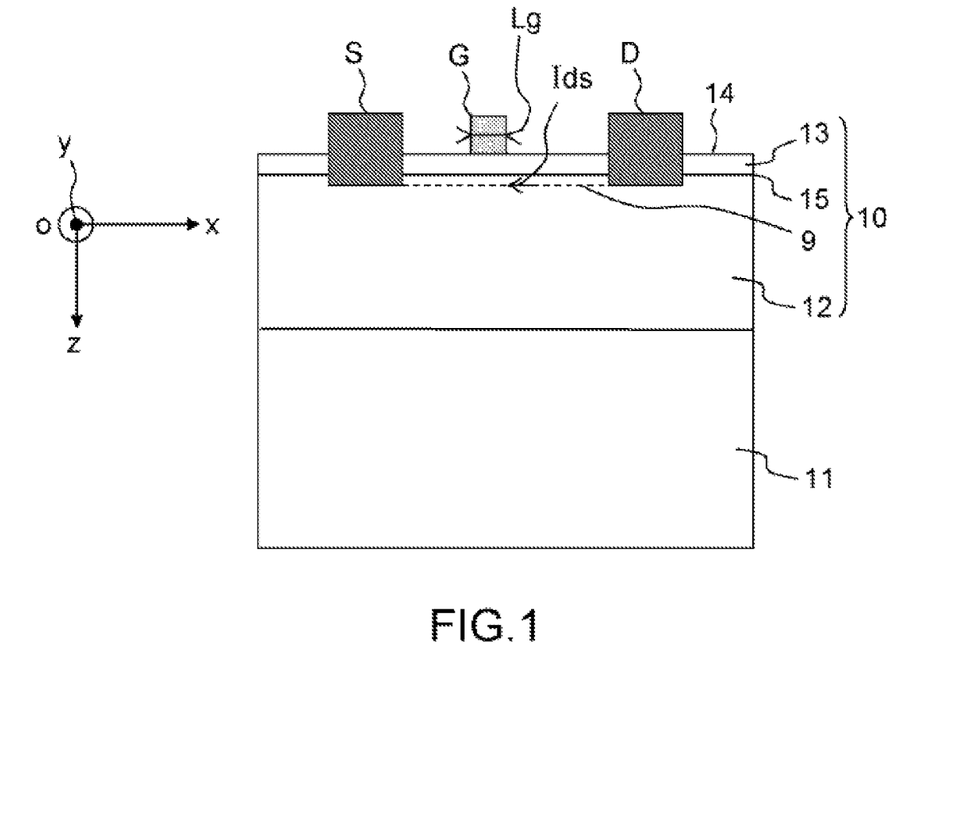
FIG. 1, already mentioned, schematically represents a cross section of the structure of a conventional elementary HEMT transistor.

FIG. 1 schematically represents a cross section, in an XZ plane, of the structure of a conventional elementary HEMT transistor produced on a substrate 11. Conventionally, an insulating or semiconductor substrate 11 is used, for example comprising silicon (Si), silicon carbide (SiC), gallium nitride (GaN) or sapphire ($Al_2O_3$), on which a stack of at least two semiconductor layers, which extend in the XY plane, is produced along the Z axis.

A first layer 12, referred to as a buffer layer, has a wide bandgap (so-called wide-gap semiconductor material) and comprises a material of the III-N family, the family of semiconductors composed of elements in group 3 of the periodic table and nitrogen, which may for example be a binary compound such as GaN or a ternary compound such as AlGaN, or more precisely $Al_xGa_{1-x}N$.

A second layer 13, referred to as a barrier layer, has a bandgap larger than that of the buffer layer 12. This layer comprises a material based on a quaternary, ternary or binary nitride compound of group III elements, referred to as a III-N compound, based on Al, Ga, In, B or Sc.

With a buffer layer made of GaN, for example, the barrier layer comprises $Al_xGa_{1-x}N$, $In_{1-x}Al_xN$ or ScAlN or a sequence $In_{1-x}Al_xN/AlN$ or $Al_xGa_{1-x}N/AlN$. The thickness of the barrier layer 13 is typically between 3 nm and 40 nm and the thickness of the buffer layer 12 is typically between 0.2 μm and 3 μm. The buffer layer 12 and the barrier layer 13 are conventionally produced by epitaxy using MOCVD or MBE. By way of example, a buffer layer based on GaN with a barrier layer based on AlGaN or InAlN, and more precisely based on $Al_xGa_{1-x}N$ or $In_zAl_{1-z}N$, with x typically between 15% and 35% and z typically between 15% and 25%, may be mentioned.

Additional layers may be present either on the surface or between the buffer layer and the barrier layer.

The junction between the buffer layer and the barrier layer constitutes a heterojunction 15, which extends in the XY plane. A two-dimensional electron gas 9 (2DEG) is localized in the vicinity of the heterojunction 15.

An HEMT transistor conventionally comprises a source S, a drain D and a gate G. The source S and the drain D are in electrical contact with the 2DEG. The X axis is defined as the alignment axis of S, G and D. The gate G is deposited on the upper face 14 of the barrier layer 13, between the source S and the drain D, and makes it possible to control the transistor. Typically, the gate-source distance is between 0.4 and 1 μm and the gate-drain distance is between 0.6 and 3 μm. The gate length Lg is defined as the dimension of the gate along the X axis.

The conductance between the source S and the drain D is modulated by the electrostatic action of the gate G, which is typically of the Schottky type or of the MIS type (metal/insulator/semiconductor), and the voltage $V_{GS}$ applied between the gate and the source controls the transistor.

The electrons of the 2DEG are mobile in the plane OXY and have a high electron mobility $\mu_e$, typically more than 1000 $cm^2$/Vs. During normal operation of the transistor, these electrons cannot flow in the Z direction because they are confined in potential wells that are formed in the plane OXY in the vicinity of the heterojunction 15. The electron gas 9, confined in what is called the channel of the transistor, is therefore capable of transporting a current Ias flowing between the drain and the source.

Conventionally, a potential difference $V_{ds}$ is applied between the source S and the drain D during operation, typically with a source S grounded, and the value of the current $I_{DS}$ is a function of the applied voltage $V_{gs}$ between the gate and the source S.

The transistor effect is based on modulation of the number of free carriers in the channel between the contacts S and D (and therefore of the current flowing between the source and the drain) by the electrostatic action of the control electrode G. The voltage amplitude $V_{gs}$ to be applied is inversely to the transconductance $g_m$ of the transistor, this transconductance itself being inversely proportional to the thickness of the barrier. This is the transistor amplification effect, which makes it possible to convert a weak signal applied to the gate into a stronger signal recovered at the drain.

Figure 2:
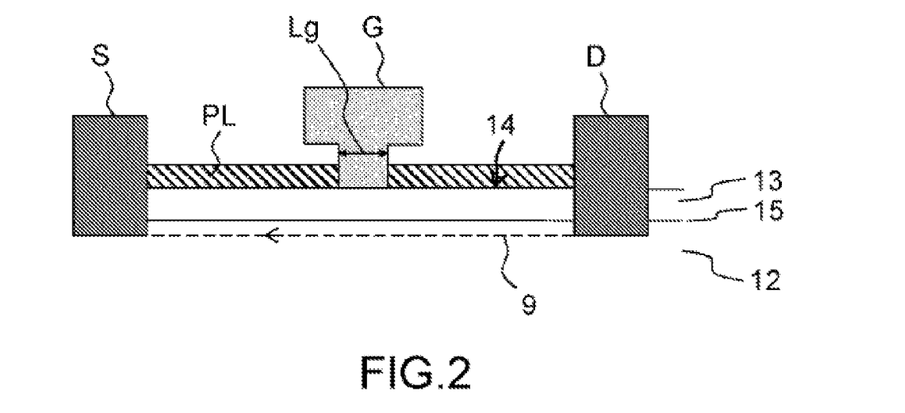
FIG. 2, already mentioned, represents a conventional HEMT transistor with a gate having a T-shape.

Preferably, for RF applications, as illustrated in FIG. 2, the gate G has a T-shape and consists of a stem with at least one cap on top (there may be several of these on one another). The two branches of the cap need not necessarily be symmetrical and the branch on the drain or source side may even be non-existent (so-called F gate). The base of the stem is commonly referred to as the gate foot.

Furthermore, according to the prior art, the face 14 is covered with a dielectric layer PL, referred to as a passivation layer, because the upper face 14 of the barrier layer 13 needs to be protected against contact with the outside. Conventionally, the dielectric materials used are: $Al_2O_3$, $Si_3N_4$, $SiO_2$, $SiO_xN_y$, BN or AlN.

Conventionally, the HEMT transistors used for the applications of interest (RF, switching) have a source S connected to the electrical ground, typically to a ground plane conventionally formed by a metallization layer arranged on the opposite side of the substrate 11 from the layer 12 (the lower side of 11 in FIG. 1). The connection is, for example, produced with the aid of connection holes, also referred to as via holes, which pass through the substrate of the source as far as the ground plane.

So that components in GaN technologies can operate at millimeter frequencies 10 GHz) with sufficient performance, it is necessary to modify a certain number of parameters that define the transistor. Among these modifications, those having first-order importance are:

Reducing the thickness of the barrier 13, which, by bringing the gate closer to the electron channel, makes it possible to improve the transconductance $g_m$ and therefore the gain of the transistor.

Increasing the number of carriers in the structures in order to reduce the access resistances.

Decreasing the gate length of the transistors, which makes it possible to reduce the transit time of the electrons under the gate. This last option may require optimization of the buffer layer 12 in order to maintain good confinement of the electrons in the channel.

Some of these modifications, however, in particular increasing the carrier density $n_s$ in the channel and reducing the thickness of the barrier, contribute to increasing the value of the electric field in the structure when the transistor is in operation. This increase in the electric field is particularly pronounced for InAl(Ga)N/GaN or AlN technologies, for which the electron density in the channel lies in the range $1.2 \times 10^{13}/cm^2$ to $2.5 \times 10^{13}/cm^2$. This is manifested by a reduced robustness of this technology.

The particularly intense electric field in these materials may locally reach an intensity of several MV/cm. When the transistor is used as a voltage amplifier (common-source mounting), the electric field maximum is located at the foot of the gate, on the drain side (it is between the gate and the drain that the greatest voltage drop is located, and the potential difference between these two electrodes may reach several tens of volts).

Because of the lack of GaN substrates with large dimensions (more than 3 inches), it is necessary to carry out the growth of the semiconductor materials on host substrates such as $Al_2O_3$, SiC or silicon. However, the latter have a lattice parameter different to that of GaN, which leads to a significant density of defects oriented perpendicularly to the current flowing in the channel. These defects extend through the entire structure and the density of defects emerging on the surface is typically of the order of from $10^8$ to a few $10^9/cm^2$. These defects constitute weak points of the transistor, which, under the effect of a high electric field and mechanical stresses induced by the reverse piezoelectric effect, will give rise to a performance degradation (increase of the gate current in particular) or even malfunction of the components. This region of an intense electric field has been identified in the literature as impacting on the reliability of the devices (see for example the publication "Correlation between Physical Defects and performance in AlGaN/GaN High Electron Mobility Transistor Devices", Transactions on Electrical and Electronic materials, Vol 11, No. 2, p. 49-53 (2010)).

One solution for reducing the intensity of the electric field would be to reduce the voltages applied to the transistor, in particular the drain voltage $V_{ds}$. This, however, would be to the detriment of the power added efficiency (PAE) and the power available at the output of the transistor.

Another solution consists in reducing the distance between the gate cap and the surface 14. However, gate profiles that make it possible to reduce the electric field sufficiently at the gate foot are accompanied by an increase in the capacitances $C_{gd}$ and $C_{gs}$ of the transistor when the electron density in the channel is more than $1.0 \times 10^{13}/cm^2$. This increase is commensurately more marked when the electron density is high and is manifested by a degradation of the power gain. For applications beyond 35 GHz, the electron density in the channel may reach values close to $2 \times 10^{13}/cm^2$. This last solution therefore has a limit for high electron densities in the channel.

Another parameter of interest of the transistor is its gain. In order to increase this, two approaches are employed:
either the gate length is reduced, although this is to the detriment of the confinement of the electrons in the channel, whence a decrease in the transconductance $g_m$ and therefore the power gain, which necessitates modification of the epitaxy in order not to degrade this last characteristic, or the thickness of the barrier is reduced, although this leads to a decrease in the electron density in the channel and ultimately to a decrease in the gain. Here again, modification of the epitaxy (at the level of the barrier) is necessary in order to compensate for this reduction.

Document JP2011-210752 describes an HEMT transistor comprising a first set of field plates FAi which are associated with a second set of field plates FBi. The combination of these two sets makes it possible to reduce the electric field in the transistor by a capacitive effect obtained between these two rows of electrodes by means of passivation between the two rows. This approach is well suited for power components used for energy conversion (switching) at a low frequency and high voltage (≥600 V), although it is not applicable for an RF (radiofrequency) power component. This is because the short distance between the gate and the drain in these RF components does not allow two rows of field plates to be produced optimally (lack of space between the gate and the drain). Furthermore, the presence of these two rows would add capacitive coupling (between the gate and the drain), which would degrade the gain of the transistor.

SUMMARY OF THE INVENTION

It is an object of the present invention to overcome the aforementioned drawbacks by providing an HEMT transistor that has a reduced electric field at the foot of the gate while maintaining an acceptable gain which is compatible with radiofrequency operation.

The present invention relates to a high-mobility field-effect transistor comprising:
a stack along a Z axis, deposited on a substrate and comprising:
a buffer layer comprising a first semiconductor material comprising a binary or ternary or quaternary nitride compound and having a first bandgap,
a barrier layer comprising a second semiconductor material comprising a binary or ternary or quaternary nitride compound and having a second bandgap, the second bandgap being greater than the first bandgap,
a heterojunction between said buffer layer and said barrier layer, and
a two-dimensional electron gas localized in an XY plane perpendicular to the axis Z and in the vicinity of the heterojunction,
a source, a drain, and a gate deposited on an upper face of the barrier layer, between the source and the drain, a distance between the source and the drain being less than or equal to 4 µm, a gate length being less than or equal to 0.5 µm,
a first dielectric layer deposited at least on an upper surface of the barrier layer, between the gate and the drain and between the gate and the source, having a relative permittivity $\varepsilon_r$ and a thickness e which are such that: 0.5 nm≤$e/\varepsilon_r$ 2 nm,
a metal pad arranged between the gate and the drain and deposited on the first dielectric layer, a length of the metal pad being less than or equal to 2 times the length of the gate, the metal pad being electrically connected to the gate.

Preferably, the relative permittivity $\varepsilon_r$ of the first dielectric layer is between 3 and 10.

Preferably, the operating frequency is between 10 and 80 GHz.

According to a first connection mode, the metal pad is electrically connected to the gate by a first metal connection.

According to one embodiment, a sum of a cross section of the gate, a cross section of the pad and a cross section of said first metal connection connecting the gate and the pad PM is greater than or equal to two times a cross section of the gate.

According to one embodiment, the first metal connection is in electrical contact with the metal pad.

According to another embodiment, the transistor furthermore comprises a second dielectric layer deposited at least on the metal pad, the first metal connection being in contact with said second dielectric layer deposited on the metal pad so as to establish a capacitive connection between the metal pad and the gate.

According to one embodiment, the first metal connection is in electrical contact with the gate.

According to another embodiment, the second dielectric layer is also deposited on the gate and the first metal connection is in contact with a part of the second dielectric layer deposited on the gate.

According to a second connection mode, the gate is connected to a gate bus and the metal pad is connected to said gate bus.

According to one embodiment, a sum of a cross section of the gate and a cross section of the pad is greater than or equal to two times a cross section of the gate.

According to one embodiment, the transistor furthermore comprises a second metal connection connecting the gate and the metal pad on the opposite side from the gate bus.

According to another aspect, the invention relates to an assembly comprising a plurality of transistors according to the invention, wherein a transistor alternately shares a source and a drain with an adjacent transistor, and wherein the sources are connected to one another by a source bridge.

BRIEF DESCRIPTION OF THE DRAWINGS

The invention will be understood more clearly, and other characteristics, aims and advantages thereof will emerge during the following detailed description with reference to the appended drawings, which are given by way of nonlimiting examples and in which.

DETAILED DESCRIPTION

Figure 3:
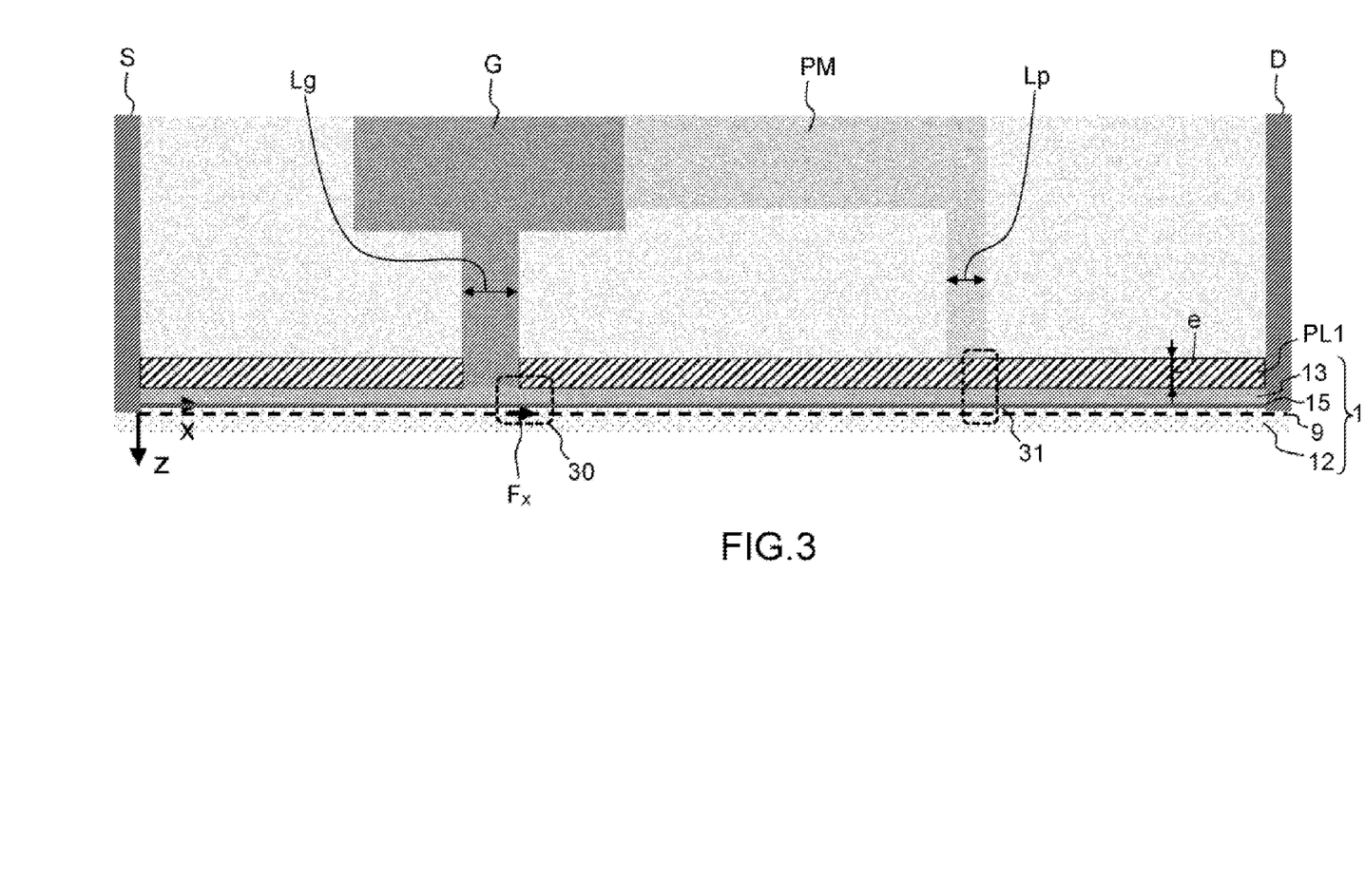
FIG. 3 illustrates a high-mobility field-effect transistor according to the invention.

The high-mobility field-effect transistor 100 according to the invention is illustrated in FIG. 3. It comprises a stack 10 along a Z axis, deposited on a substrate 11, which comprises:
- a buffer layer 12 comprising a first semiconductor material comprising a binary or ternary or quaternary nitride compound and having a first bandgap (typically GaN),
- a barrier layer 13 comprising a second semiconductor material comprising a binary or ternary or quaternary nitride compound and having a second bandgap, the second bandgap being greater than the first bandgap (typically InAlN, or AlGaN or InAlGaN),
- a heterojunction 15 between the buffer layer 12 and the barrier layer 13, and
- a two-dimensional electron gas 9 localized in an XY plane perpendicular to the axis Z and in the vicinity of the heterojunction 15.

Preferably, a thin layer 15 of AlN (typically having a thickness of from 1 to 2 nm) is added between the buffer layer 12 and the barrier 13 in order to increase the electron density and the electron mobility in the channel.

The transistor also comprises, in the conventional way, a source S, a drain D, and a gate G deposited on an upper face 14 of the barrier layer 13, between the source S and the drain D. The alignment S/G/D defines the axis X of interest of the component. The origin O of the coordinate system (x, z) is taken at the foot of the source S, at the interface between the barrier and the buffer layer. The gate has for example a rectangular or T- or Γ-shape. The transistor according to the invention is configured to operate at high frequency, typically between 10 and 80 GHz. For this purpose, it is necessary for the distance $d_{SD}$ between the source and the drain (along the X axis) to be less than or equal to 4 µm, with a gate length Lg (along the X axis) less than or equal to 0.5 µm. Specifically, the operating frequency dictates the various distances $d_{SG}$, $d_{GD}$ and Lg.

The following relationship applies: $d_{SD}=d_{SG}+d_{GD}+Lg$

For an RF power transistor, it is necessary to have:
- an input resistance (between the source and the gate) which is as low as possible. This resistance is proportional to the gate-source distance $d_{SG}$.

a gate with a length such that the transit time of the electrons under this gate is compatible with the intended operating frequency. Typically, with Lg=0.5 µm the transistor operates up to 10 GHz, with Lg=0.25 µm it operates up to 20 GHz, with Lg=0.15 µm it operates up to 35 GHz, with Lg=0.1 µm up to 50 GHz, and with Lg=0.065 µm up to 80 GHz.

an output resistance which is as low as possible, but with the additional constraint (in comparison with the input) that the distance $d_{GD}$ between the gate and the drain is sufficiently large to withstand the voltage applied between the drain and the gate (if it is too short, this may lead to destruction of the component by avalanche breakdown). This distance $d_{GD}$ is therefore a compromise between these two requirements.

It should be noted that for nitride-based transistors, a high electron density in the channel is necessary for these RF applications.

In the conventional way, the transistor comprises a first dielectric layer PL1 (passivation layer) deposited at least on the upper surface 14 of the barrier layer 13, between the gate G and the drain D and between the gate G and the source S. However, this passivation layer has a particular thickness in the transistor according to the invention.

The transistor according to the invention also comprises a metal pad PM arranged between the gate G and the drain D. The metal pad PM is arranged between the gate G and the drain D and is deposited on the first dielectric layer PL1. Furthermore, the metal pad is electrically connected to the gate. As described below, this pad has an effect on the electric field localized at the foot of the gate on the drain side.

The source, the drain and the gate are commonly referred to as electrodes, and according to this nomenclature the pad PM may be likened to a fourth electrode. The pad PM is made of metal, typically Au.

In relation to the presence of the pad, the passivation layer PL1 according to the invention has a relative permittivity $\varepsilon_r$ and a thickness e, which are such that:

$$0.5 \text{ nm} \le e/\varepsilon_r \le 2 \text{ nm} \quad (1)$$

The upper bound of the parameter $e/\varepsilon_r$ is determined by simulation (see below). The ratio $e/\varepsilon_r$ cannot have a value of less than 0.5 nm either, because the electric field in this passivation under the pad PM would exceed the breakdown field of the material, which would degrade this passivation PL1.

For optimum operation of the pad, it is also expedient (see below) for it not to have a size that is too great in relation to the gate, that is to say for the length Lp of the metal pad along the X axis to be less than or equal to 2 times the length Lg of the gate: Lp≤2.Lg.

The value of the ratio $R=e/\varepsilon_r$ of the layer PL1, according to the invention, is much less than is commonly the practice in transistors of the prior art, in which this passivation layer typically has a thickness of 50 nm-2 µm, with permittivities typically between 3 and 10, that is to say an R of between 5 nm and 667 nm.

Preferably, for the invention, the relative permittivity $\varepsilon_r$ is between 3 and 10. This is because with a higher permittivity, a breakdown field of the material would be achieved which is too low in relation to the field applied during operation of the component. Furthermore, these permittivity values correspond to the technologically most well-established materials. These preferred permittivity values then lead to a thickness e of the passivation layer of between 1.5 nm and 20 nm.

In FIG. 3, the zone 30 is the critical zone of the component. The electric field is intense there, and since there is a high dislocation density in this barrier 13 because of the reverse piezoelectricity phenomenon, this is a zone of weakness of the component. Creation of conduction paths then takes place between the gate and the channel by means of these defects, which is ultimately manifested by an increase in the gate leakage currents and a degradation of the performance of the transistor. Fx_canal denotes the component of the field along x in the channel. The channel is located in the buffer layer at a few nm from the interface with the barrier or the layer 15, when it is present.

Figure 4:
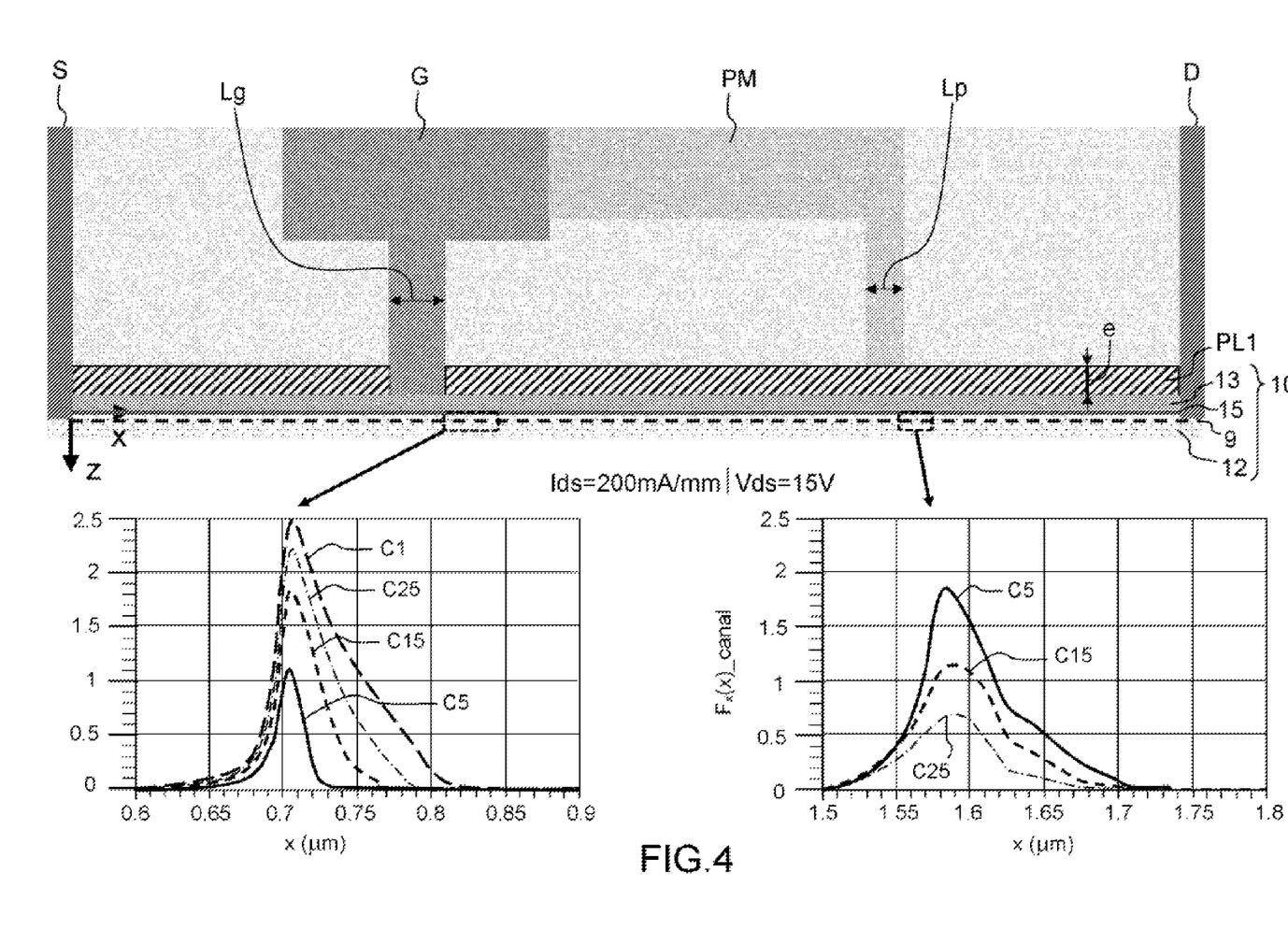
FIG. 4 illustrates the effect of the metal pad on the electric field in the channel for a transistor operating at the bias point (in this example $V_{ds}$ equal to 15 V and Ids equal to 0.2 A/mm). The upper part illustrates the gate of the transistor and the pad deposited on the passivation layer. The lower part illustrates the value Fx(x)_Canal of the component along x of the electric field in the channel as a function of x and as a function of various thicknesses of the passivation layer.
Figure 5:
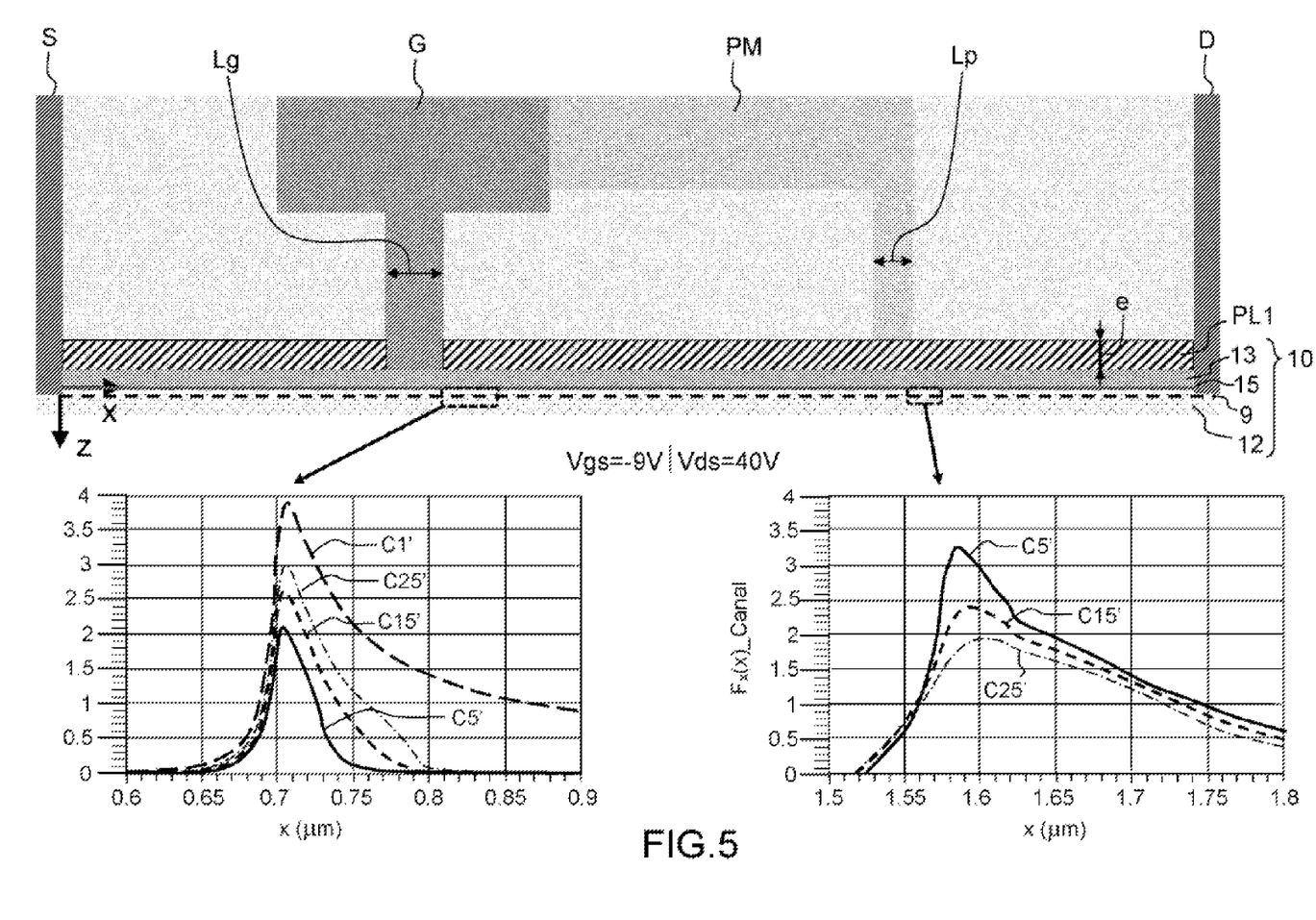
FIG. 5 illustrates the effect of the metal pad on the electric field in the channel for a transistor operating at a voltage $V_{dsMAX}$ equal to 40 V and $V_{gsMAX}$ equal to −9 V. The upper part illustrates the gate of the transistor and the pad deposited on the passivation layer. The lower part illustrates the value Fx(x)_Canal of the component along x of the electric field in the channel as a function of x and as a function of various thicknesses of the passivation layer.

As will be shown in FIGS. 4 and 5, the zone 31 illustrates the location of a new electric field at the foot of the pad PM. The addition of a 4th electrode (PM) very close to the barrier and separated therefrom by a passivation PL1 makes it possible to reduce the intensity of the electric field at the gate foot, in the channel and the barrier, by offsetting it to the foot of this 4th electrode, which, being insulated from the barrier and its passivation defects, makes it possible to eliminate this cause of weakness.

The effect of the pad PM as claimed on the electric field in the vicinity of the foot of the gate is illustrated in FIGS. 4 and 5. In these two figures, the upper part illustrates the gate of the transistor and the pad PM deposited on the layer PL. The lower part illustrates the value Fx(x)_Canal of the component along x of the electric field as a function of x (with an origin O selected at the source, as illustrated in FIG. 3) as a function of various thicknesses e of the layer PL1. These simulations were carried out by TCAD (Technology Computer-Aided Design), which is a branch of electronic CAD aiming to model the manufacture and operation of semiconductor devices.

In this example, the gate foot-source distance is 0.7 µm and the gate foot-drain distance is 1.4 µm, and the length Lg of the gate is 110 nm. The pad PM has a length Lp of 75 nm and is located at 800 nm from the gate foot lying on the side of the drain (see the scale x in FIGS. 4 and 5).

FIG. 4 corresponds to the behavior of the field when the component is at the bias point (quiescent point) with the parameters:

$V_{ds}$=15 V; $I_{ds}$=0.2 A/mm (for operation in class AB) and the carrier density $n_s$ in the channel is of the order of $1.6 \cdot 10^{13}/\text{cm}^2$.

The charge density $n_s$ (set by the materials used) dictates the maximum operating voltage $V_{dsMAX}$ which can be applied to the transistor, this operating voltage $V_{ds}$ having to be less than $V_{dsMAX}$.

FIG. 5 corresponds to the behavior of the field when the component is at the operating point with a maximum $V_{ds}$ of $V_{dsMAX}$=40 V and $V_{gsMAX}$=-9 V.

In this example, a layer PL1 of $Si_3N_4$ is selected (usual case), with a relative permittivity $\varepsilon_r$ equal to 7.5 and a variable thickness e.

In these two figures, the two curves C1 and C1' illustrate the field Fx(x)_Canal without a pad (the thickness e of the layer PL1 then has no effect). The subsequent curves incorporate the presence of a pad PM. The curves C5 and C5' correspond to a thickness e of PL1 equal to 5 nm, the curves C15 and C15' to a thickness of PL1 equal to 15 nm, and the curves C25 and C25' to a thickness of PL1 equal to 25 nm. For the simulation, $\varepsilon_r$=7.5 was taken, a value of the nitride which is a material used very widely for passivation. Thus, in the simulations $e$=5 nm↔$R=e/\varepsilon_r$=0.66

$e$=15 nm↔$R=e/\varepsilon_r$=2

$e$=25 nm↔$R=e/\varepsilon_r$=3.33

It may be seen in these two figures, which illustrate two situations of the component (at the operating point of the transistor and at the maximum voltages applied to the drain and the gate), that the effect of the presence of the pad PM connected to the gate is to reduce the intensity of the peak P1 of the electric field Fx(x)_Canal at the foot of the gate located on the drain side. Together with this reduction, the growth of a second electric field peak P2 is observed at the foot of the pad PM, also located on the side of the drain. It is also observed that the lower the ratio R is, the more the intensity of the electric field at the foot of the gate is reduced and the more that at the foot of PM is increased.

It may be seen that for (25 nm and $\varepsilon_r=7.5$) i.e. R=3.33, the field at the foot of the gate is not substantially reduced, the effect becoming clearer beyond (15 nm and $\varepsilon_r=7.5$) i.e. R=2 (reduction of the field by at least 30%).

Figure 6:
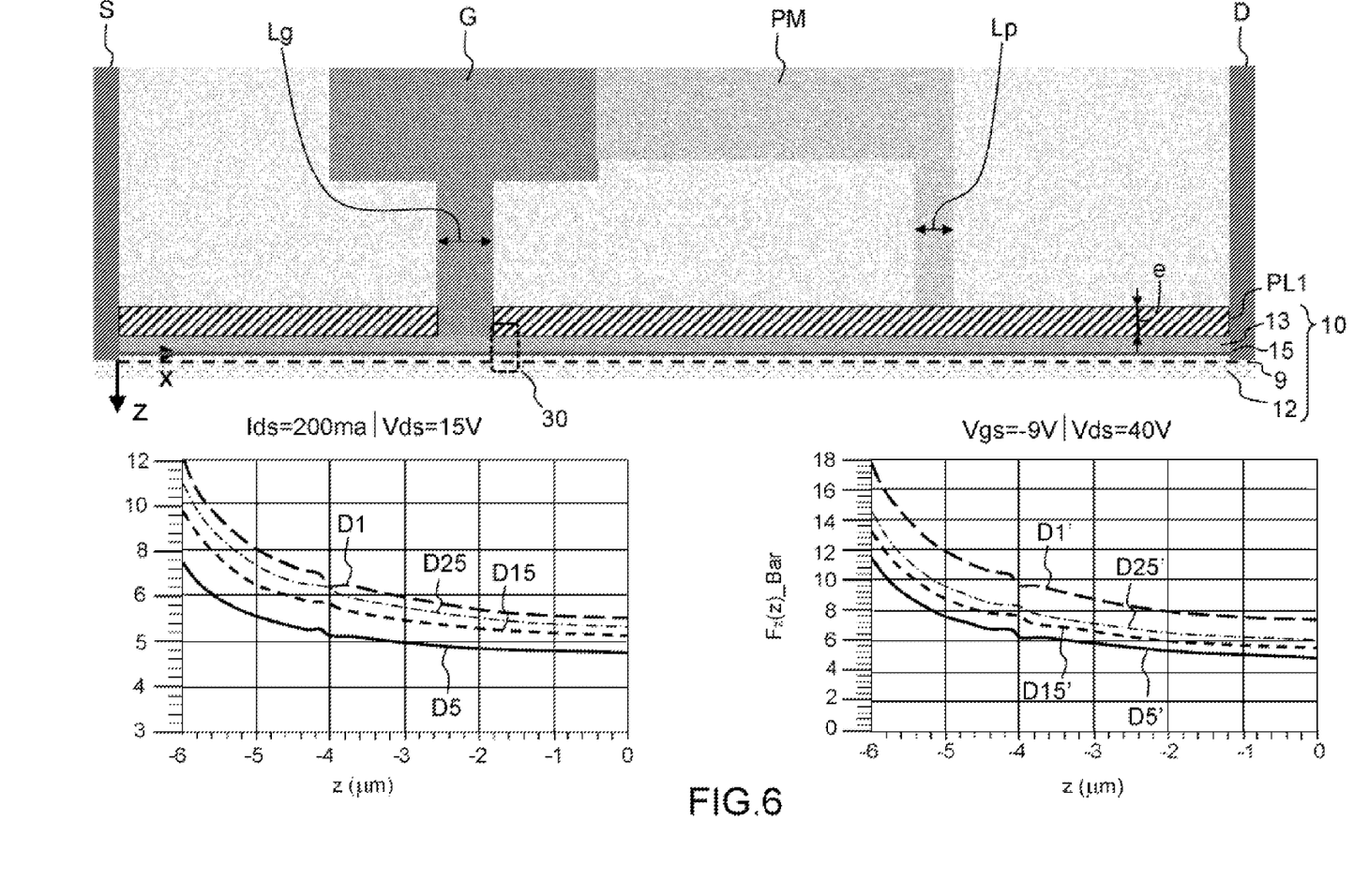
FIG. 6 illustrates the evolution of the component of the electric field Fz(z)_Bar along z in the barrier as a function of z.

It is the capacitive effect induced by the presence of the metal pad PM associated with the dielectric layer PL1 which modifies the distribution of the field. The capacitive effect is created between the pad PM and the 2D electron gas 9 by means of the first passivation layer PL1. This pad PM allows an electrical potential to be brought between the gate and the transistor at $V_{dsMAx}$=40 V and $V_{gsMAX}$=−9 V. The curves D5, D15 and D25 on the left correspond respectively to a passivation layer thickness of 5 (R=0.66), 15 (R=2) and 25 nm (R=3.33), likewise for the curves D5', D15' and D25' on the right. An excessive value of the field Fz(z)_Bar gives rise to weaknesses of the component due to the deformation of the crystal lattice by means of the stresses induced by the reverse piezoelectric effect. These weaknesses are manifested by the creation of parasitic conduction paths between the gate and the 2DEG channel, leading to degradation of the microwave performance of the transistor.

A decrease in the field Fz(z)_Bar at the foot of the gate on the drain side in the depth of the barrier layer may be observed, which is increasingly marked when the thickness becomes thin.

Furthermore, the gain of the transistor which is obtained for the four values of R, 0.66, 2, 3.33 and 4, was simulated and the results are given in Table I below, which also summarizes the results for the electric field at the foot of the gate.

For the gain, the quiescent operating point and a frequency of 35 GHz were assumed.

TABLE I

| ratio $R = e/\varepsilon r$ of the layer PL1 | Difference in the gain at Ids = 200 mA/mm Vds = 15 V & 35 GHz in relation to the reference* | Relative difference in relation to the reference* in the electric field Fx(x) in the channel** | | Relative difference in relation to the reference* in the electric field Fz(z) in the barrier*** | |
|---|---|---|---|---|---|
| | | Ids = 200 mA/mm Vds = 15 V | Vgs = −9 V Vds = 40 V | Ids = 200 mA/mm Vds = 15 V | Vgs = −9 V Vds = 40 V |
| R = 0.66 | −0.25 dB i.e. −5% | 0.44 | 0.52 | 0.62 | 0.64 |
| R = 2 | −0.9 dB i.e. −18% | 0.73 | 0.68 | 0.81 | 0.73 |
| R = 3.33 | −1.5 dB i.e. −29% | 0.88 | 0.77 | 0.92 | 0.81 |
| R = 4 | −1.9 dB i.e. −35% | 0.94 | 0.8 | 0.97 | 0.86 |

*reference: no pad PM
**taken at the foot of the gate on the drain side in the channel (critical zone of the component)
***taken at the foot of the gate on the drain side in the barrier (critical zone of the component).

drain, which makes it possible to reduce the density of electrons localized at the interface between the materials 13 and 12 which are in line with this pad. Its action is commensurately greater when this pad is close to the electron gas 9 and the ratio R is small.

The length Lg of the gate (that is to say its stem for a T- or Γ-gate) determines the maximum operating frequency of the transistor. In order not to degrade the performance of the transistor (particularly the gain) excessively, the pad PM must not have too great a length Lp because this would lead to a degradation of the power gain of the transistor. With the aid of simulations, the Inventors have determined that it is expedient for Lp to be less than or equal to 2 times the gate length Lg (along the alignment axis X). The criterion is that beyond this length of the pad equal to 2 times Lg, more than 1 dB is lost from the gain.

It should be noted that the reduction of the electric field peak P1 is more marked for $V_{dsMAX}$=40 V and $V_{gsMAX}$=−9 V, the pairing (15 nm and $\varepsilon_r$=7.5) i.e. R=2 making it possible to reduce the field from 4 MV/cm to 2.5 MV/cm.

FIG. 6 illustrates an additional beneficial effect of the pairing (pad PM, PL1 with low R). FIG. 6 illustrates the evolution of the component Fz(z)_Bar of the electric field along z in the barrier 13 as a function of z (the point 0 corresponding to the start of the additional layer 15). The curves on the left correspond to the transistor at the operating point (in the example selected, $I_{ds}$=0.2 A/mm and $V_{ds}$=15 V) and the curve on the right corresponds to the In terms of the gain, the presence of the pad tends to reduce the gain, more markedly when the thickness e increases. A loss ranging up to 1 dB is considered to be acceptable, and beyond this the performance is considered to be degraded. For a ratio R of 2, the situation is below 1 dB (0.9), and for R=3.33 this threshold has been exceeded (1.5). These results confirm the selection of a passivation layer (e, $\varepsilon_r$) such that $e/\varepsilon_r$ 2 in order to produce the transistor according to the invention.

For the field Fx(x)_Canal, a ratio R=2 makes it possible to have at least 30% reduction of the maximum field (without a pad). For the field Fz(z)_Bar, the ratio R=2 makes it possible to have at least 25% reduction of the maximum field.

For ratios 3-4 (and beyond), the effect of reducing the peak P1 is weak and the gain loss is greater.

This effect of spreading the electric field is not dependent to first order on the position of the pad in the gate-drain space. Preferably, the pad PM is not too near the gate or the drain. If the pad PM is too close to the drain contact, this is manifested by an increase in $C_{gd}$ and therefore a reduction in the gain, and if it is placed too close to the gate, this becomes difficult to implement. Furthermore, if the bridge connecting the gate and the pad PM is not long enough, this will be manifested by a gate resistance which is too high. Thus, preferably, the pad-drain distance is greater than or equal to 300 nm and the pad-gate distance is greater than or equal to 200 nm.

One solution that makes it possible to simplify manufacture is that the metal pad has a pattern identical to the pattern of the gate. It is therefore produced by duplicating the gate.

The metal pad PM is electrically connected to the gate G via a metal connection. Various examples of this connection mode are described below.

Figure 7:
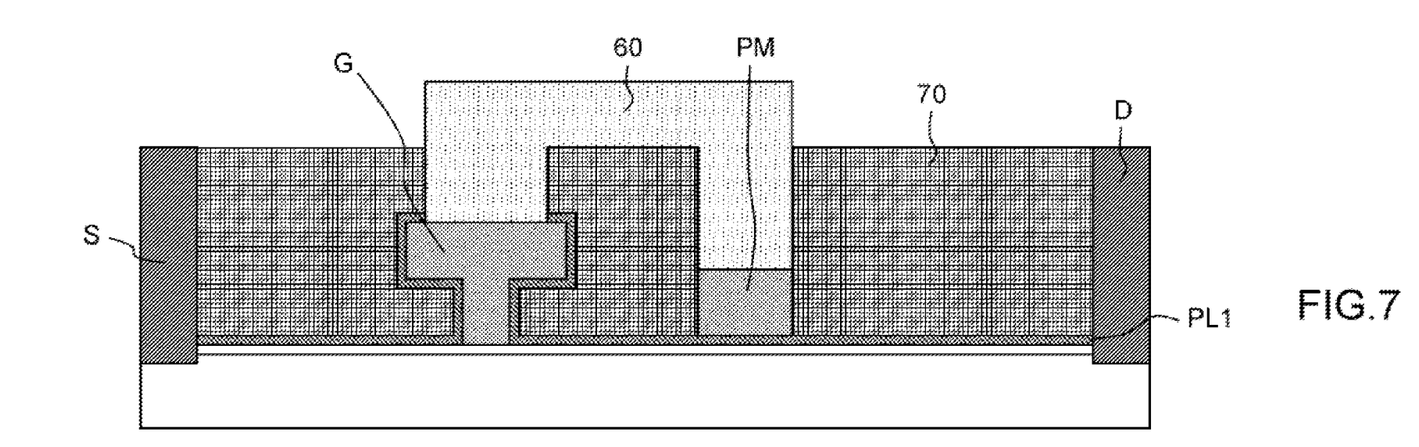
FIG. 7 illustrates a preferred first option of gate-pad connection "through the top", in which the first metal connection electrically connects the gate and the metal pad by establishing a direct connection.
Figure 8:
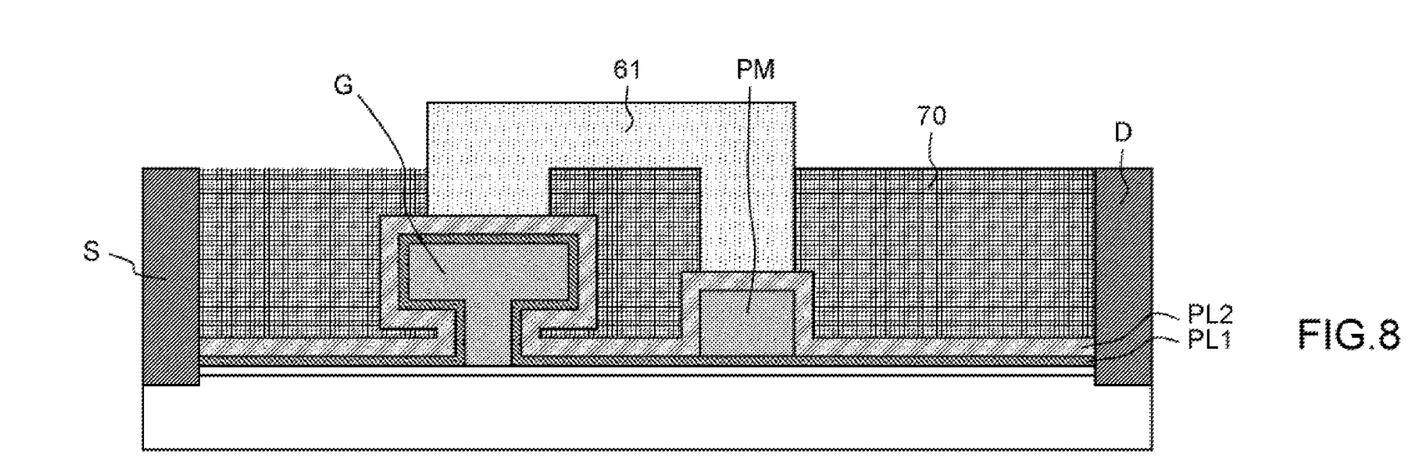
FIG. 8 illustrates a first alternative of a second option in which said connection between the gate and the pad is capacitive, in which the connection is made through the passivation layers.
Figure 9:
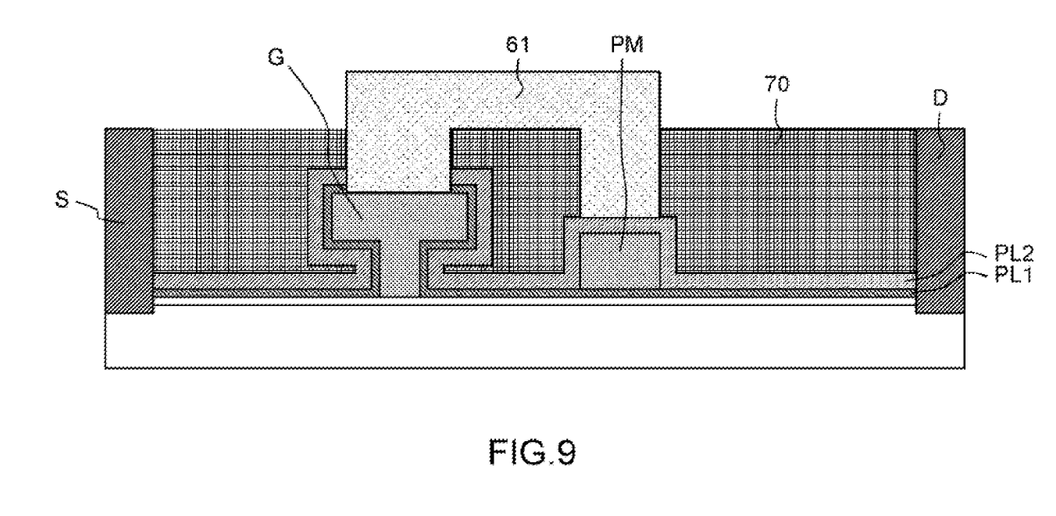
FIG. 9 illustrates a second alternative of the second option in which the connection between the gate and the pad is capacitive, in which the connection is made through the layer PL2 on the metal pad side, the contact therewith on the gate side being direct.

The first connection mode "through the top" is illustrated in FIGS. 7 to 9. The metal pad is electrically connected to the gate by a first metal connection.

According to a preferred first option, which is illustrated FIG. 7, the first metal connection 60 electrically connects the gate G and the metal pad PM by producing a direct connection (of the resistive type, with a resistance that is as low as possible). When the gate is covered by the layer PL1, it is expedient to open a passage onto the gate cap in order to establish the connection. With this configuration, it is not necessary to optimize the capacitance, and it makes it possible to reduce the electric fields most strongly (see the simulations above carried out in this case). It does, however, make production more complex because it requires an opening to be formed in the passivation present on the gate in order to obtain a direct contact.

According to a second option, which is illustrated in FIGS. 8 and 9, the transistor comprises a second dielectric layer PL2 deposited at least on the metal pad PM, the first metal connection 61 being in contact with said second dielectric layer PL2 deposited on the pad PM. The metal pad and the gate are then connected by a capacitive connection. This configuration makes production simpler because it does not require an opening to be formed in the passivation present on the gate. However, it is then necessary to optimize the capacitance, and it is less effective in reducing the electric fields.

Typically, during manufacture, the layer PL1 covers the gate and the layer PL2 covers the pad and the gate, as illustrated in FIGS. 8 and 9.

According to one alternative, which is illustrated in FIG. 8, the capacitive connection between G and PM is carried out through PL1 and PL2 on the side of the gate G and through PL2 on the side of the metal pad PM. The first metal connection 61 is in contact with the part of the second dielectric layer PL2 deposited on the gate.

According to another alternative, which is illustrated in FIG. 9, the capacitive connection between G and PM is carried out through PL2 on the side of the metal pad, the contact therewith on the gate side being direct, an opening having been formed onto the gate cap. The first metal connection 61 is then in electrical contact with the gate.

If the pad PM has too high an electrical resistance, the losses will increase and the gain of the transistor will decrease. It is desirable for the pad to have a relatively low resistance, typically comparable with the electrical resistance of the gate or less. The sum $\Sigma S$ of the cross sections is defined as being equal to the sum of the cross section $S_G$ of the gate, the cross section SPM of the pad PM and the cross section of the connection 60 or 61. The cross sections of these various elements are defined in the plane OXZ, a plane which is perpendicular to the flow of the gate current. Preferably, $\Sigma S$ should be greater than or equal to 2 times the cross section of the gate. If these various elements are composed of the same metal, this ensures that the resistance of the assembly (gate+bridge/connection 60 or 61+pad PM) is at least less or equal by a factor of 2 than that of the gate alone (reference case without a pad PM).

According to one embodiment, the gates are connected together by means of a gate bus G-bus and the drains are connected together by means of a drain bus D-bus located in a plane P1. The sources are connected together with a "source bridge" PS passing over a passivation layer and located in a plane P2 above P1.

Figure 10:
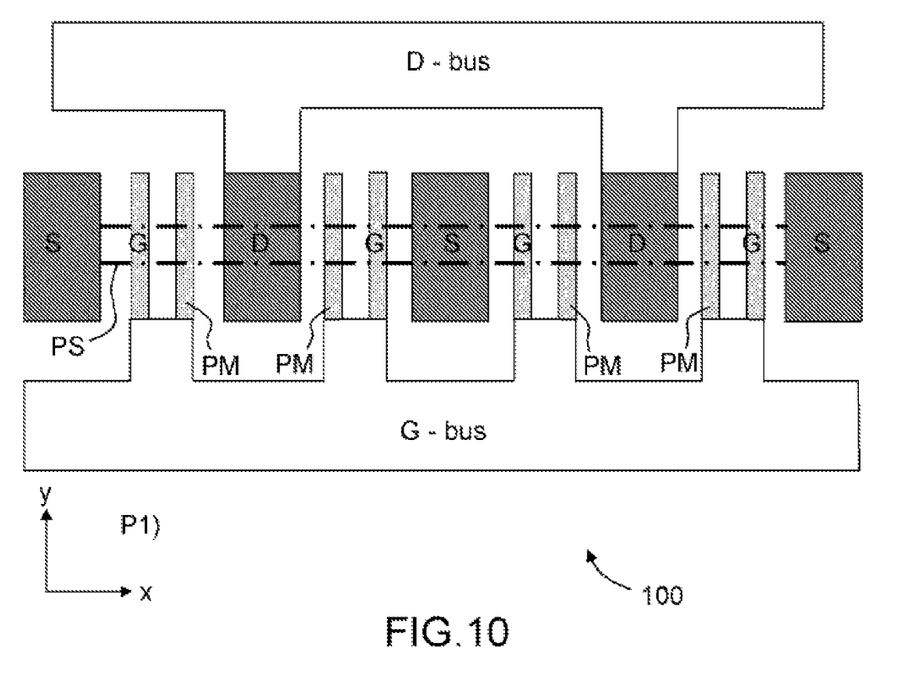
FIG. 10 illustrates a "planar" gate-pad connection mode, in which the metal pad is connected to the gate bus.

According to a second connection mode, the metal pad PM is connected to the gate bus G-Bus by one of its ends, PM and G thus both being connected to the gate bus. FIG. 10 illustrates this connection mode for a group 100 of transistors in which a transistor alternately shares a source and a drain with the adjacent transistor. This connection is easy to produce technologically, and it may be resistive or capacitive.

Figure 11:
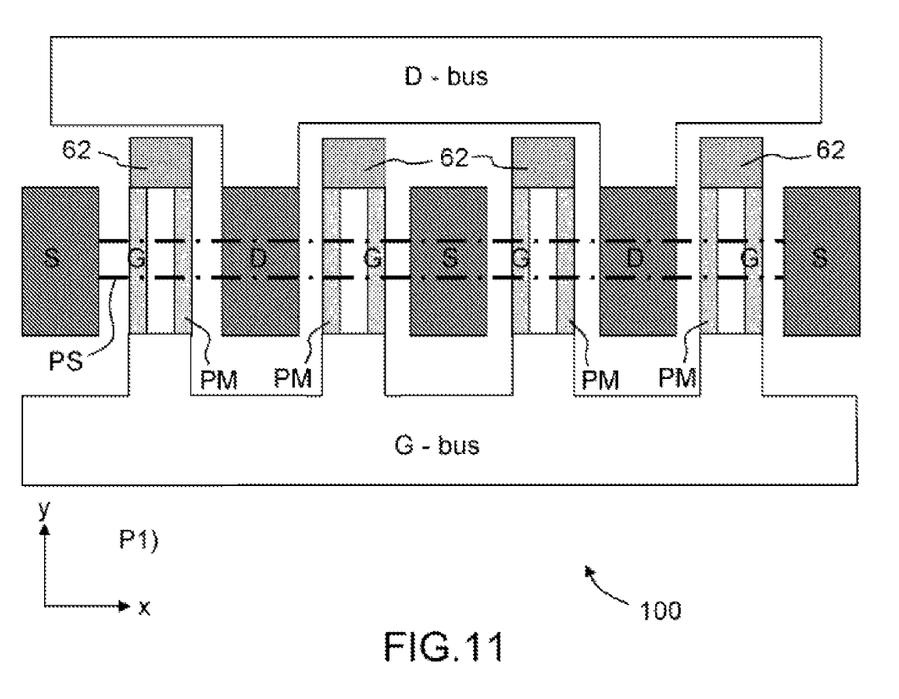
FIG. 11 illustrates a variant of the gate-pad connection mode of FIG. 10, in which a second metal connection connects the gate and the metal pad on the opposite side from the gate bus.

According to a variant of this connection mode, which is illustrated in FIG. 11, a second metal connection 62 connects the gate and the metal pad on the opposite side from the gate bus G-bus, via the opposite end of the pad PM from the gate bus. This makes it possible to reduce the gate resistance by a factor of 2, which is advantageous for the gain of the transistor.

In the case of connection by means of the gate bus, the condition for the sum of the cross sections is expressed without the cross section of the bridge. This is equivalent to saying that the sum of the cross section SPM of the pad PM+the cross section $S_G$ of the gate G is greater than or equal to two times the cross section $S_G$ of the gate G.

The invention claimed is:

1. A high-mobility field-effect transistor operating at a frequency of between 10 and 80 GHz, comprising:
    a stack along a Z axis, arranged on a substrate and comprising:
        a buffer layer comprising a first semiconductor material comprising a binary or ternary or quaternary nitride compound and having a first bandgap,
        a barrier layer comprising a second semiconductor material comprising a binary or ternary or quaternary nitride compound and having a second bandgap, the second bandgap being greater than the first bandgap,
        a heterojunction between said buffer layer and said barrier layer, and
        a two-dimensional electron gas localized in an XY plane and in the vicinity of the heterojunction,
    a source(S), a drain (D), and a gate (G) arranged on an upper face of the barrier layer, between the source and the drain, a distance between the source and the drain being less than or equal to 4 µm, a gate length (Lg) being less than or equal to 0.5 µm,
    a first dielectric layer (PL1) arranged at least on an upper surface of the barrier layer, between the gate (G) and the drain (D) and between the gate (G) and the source (S), having a relative permittivity $\varepsilon_r$ and a thickness e which are such that: 0.5 nm≤e/$\varepsilon_r$≤2 nm,
    a metal pad (PM) arranged between the gate (G) and the drain (D) and deposited on the first dielectric layer (PL1), said metal pad forming a structure having a length (Lp) and a foot in contact with the first dielectric layer, said length of the metal pad being less than or equal to 2 times the length (Lg) of the gate, the metal pad being electrically coupled to the gate by a first metal connection, a distance between the metal pad and the drain being greater than or equal to 300 nm and a distance between the metal pad and the gate being greater than or equal to 200 nm,
    a sum of a surface of a cross section of the gate, a cross section of the metal pad and a cross section of the first metal connection connecting the gate and the metal pad (PM) is greater than or equal to two times a surface of a cross section (SG) of the gate (G), said cross sections being along an XZ plane.

2. The transistor as claimed in claim 1, wherein the relative permittivity $\varepsilon_r$ of the first dielectric layer is between 3 and 10.

3. The transistor as claimed in claim 1, wherein the first metal connection is in electrical contact with the metal pad.

4. The transistor as claimed in claim 1, furthermore comprising a second dielectric layer (PL2) deposited at least on the metal pad (PM), the first metal connection being in contact with said second dielectric layer deposited on the metal pad so as to establish a capacitive coupling between the metal pad and the gate.

5. The transistor as claimed in claim 4, wherein the first metal connection is in electrical contact with the gate.

6. The transistor as claimed in claim 4, wherein the second dielectric layer (PL2) is also deposited on the gate, and wherein the first metal connection is in contact with a part of the second dielectric layer deposited on the gate.

7. The transistor as claimed in claim 4, wherein the gate is connected to a gate bus (G-Bus) and the metal pad is connected to said gate bus.

8. The transistor as claimed in claim 7, furthermore comprising a second metal connection connecting the gate and the metal pad on the opposite side from the gate bus (G-bus).

9. An assembly comprising a plurality of transistors as claimed in claim 1, wherein a transistor alternately shares a source and a drain with an adjacent transistor, and wherein the sources are connected to one another by a source bridge (PS).

* * * * *